United States Patent
Lecheler

(10) Patent No.: US 11,095,109 B2
(45) Date of Patent: Aug. 17, 2021

(54) DEVICE FOR RECOGNIZING AN ARCING FAULT, AND ELECTRICAL SWITCHGEAR

(71) Applicant: Siemens Aktiengesellschaft, Munich (DE)

(72) Inventor: Stefan Lecheler, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 683 days.

(21) Appl. No.: 15/745,544

(22) PCT Filed: May 23, 2016

(86) PCT No.: PCT/EP2016/061557
§ 371 (c)(1),
(2) Date: Jan. 17, 2018

(87) PCT Pub. No.: WO2017/045778
PCT Pub. Date: Mar. 23, 2017

(65) Prior Publication Data
US 2018/0212416 A1    Jul. 26, 2018

(30) Foreign Application Priority Data
Sep. 15, 2015  (DE) .................. 10 2015 217 633.9

(51) Int. Cl.
*H02H 1/00*    (2006.01)
*H02H 7/22*    (2006.01)
(Continued)

(52) U.S. Cl.
CPC ........... *H02H 1/0023* (2013.01); *G01N 21/67* (2013.01); *G01R 31/1218* (2013.01);
(Continued)

(58) Field of Classification Search
CPC .............. G01N 21/67; G01R 31/1218; G01R 31/3275; H01H 33/26; H02B 13/065; H02H 1/0023; H02H 7/22; H02H 7/222
See application file for complete search history.

(56) References Cited

U.S. PATENT DOCUMENTS

| 4,433,245 A | * | 2/1984 | Poultney | ................ G01C 11/02 250/253 |
| 4,941,747 A | * | 7/1990 | Dakin | .................... G01N 21/31 356/454 |

(Continued)

FOREIGN PATENT DOCUMENTS

| CN | 102520326 A | * | 6/2012 |
| CN | 202373539 U | * | 8/2012 |

(Continued)

OTHER PUBLICATIONS

J. Maftoul et al., "Absorption of Arc Radiation by a Cold SF6 Gas", (IEEE [online]. ieeexplore.org [retrieved on Jun. 7, 1993]. Retrieved from the Internet: <URL: https://ieeexplore.ieee.org/stamp/stamp.jsp?tp=&arnumber=593619> (Year: 1993).*

(Continued)

*Primary Examiner* — Jared Fureman
*Assistant Examiner* — Nicolas Bellido
(74) *Attorney, Agent, or Firm* — Harness, Dickey & Pierce, P.L.C.

(57) ABSTRACT

Disclosed is a device for recognizing an arcing fault in incident light that includes a sensor for detecting absorption lines of the incident light, and an evaluation unit which generates an evaluation signal when characteristic absorption lines are detected.

24 Claims, 2 Drawing Sheets

(51) Int. Cl.
*G01N 21/67* (2006.01)
*G01R 31/12* (2020.01)
*G01R 31/327* (2006.01)
*H01H 33/26* (2006.01)
*H02B 13/065* (2006.01)

(52) U.S. Cl.
CPC ........... *G01R 31/3275* (2013.01); *H02H 7/22* (2013.01); *H02H 7/222* (2013.01); *H01H 33/26* (2013.01); *H02B 13/065* (2013.01)

(56) References Cited

U.S. PATENT DOCUMENTS

| | | | | |
|---|---|---|---|---|
| 5,193,049 | A * | 3/1993 | Jackson | H02B 13/025 |
| | | | | 361/676 |
| 7,123,154 | B1 | 10/2006 | Smith | |
| 7,580,232 | B2 * | 8/2009 | Caggiano | G01R 31/088 |
| | | | | 361/2 |
| 9,653,904 | B2 * | 5/2017 | Schweitzer, III | G01D 18/00 |
| 10,320,176 | B2 * | 6/2019 | Bartonek | H02H 1/0023 |
| 2008/0094612 | A1 * | 4/2008 | Land | G01J 1/429 |
| | | | | 356/51 |
| 2008/0239322 | A1 * | 10/2008 | Hodgkinson | G01N 21/0303 |
| | | | | 356/437 |
| 2011/0026183 | A1 * | 2/2011 | Wu | H01T 2/02 |
| | | | | 361/115 |
| 2014/0219312 | A1 * | 8/2014 | Uchii | G01J 5/602 |
| | | | | 374/121 |

FOREIGN PATENT DOCUMENTS

| | | | | |
|---|---|---|---|---|
| CN | 103809043 A | | 5/2014 | |
| DE | 29502452 U1 | | 6/1996 | |
| DE | 4440281 C2 | | 7/2000 | |
| DE | 202012001729 U1 | | 4/2012 | |
| GB | 2411953 A | * | 9/2005 | ............ G01N 21/39 |
| WO | WO 2010015269 A1 | | 2/2010 | |

OTHER PUBLICATIONS

Chinese Office Action and English translation thereof dated Nov. 5, 2018.

Gerlach W.: "Physik des täglichen Lebens"; Eine Anleitung zu physikalischem Denken und zum Verständnis der physikalischen Entwicklung; Springer-Verlag Gottingen Heidelberg; ISBN 13:978-3-540-02144-5; pp. 139-141; 1957.

German Office Action, dated Apr. 26, 2016. German Application No. 2015P18568 DE.

Internation Search Report dated Aug. 18, 2016. German Application No. 2015P18568WO, PCT/EP2016/061557.

* cited by examiner

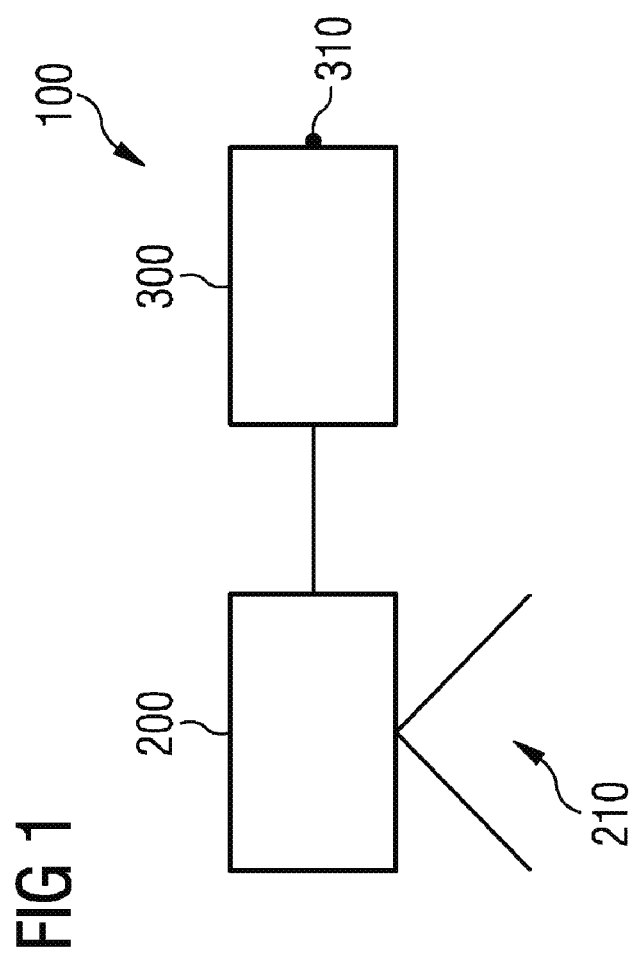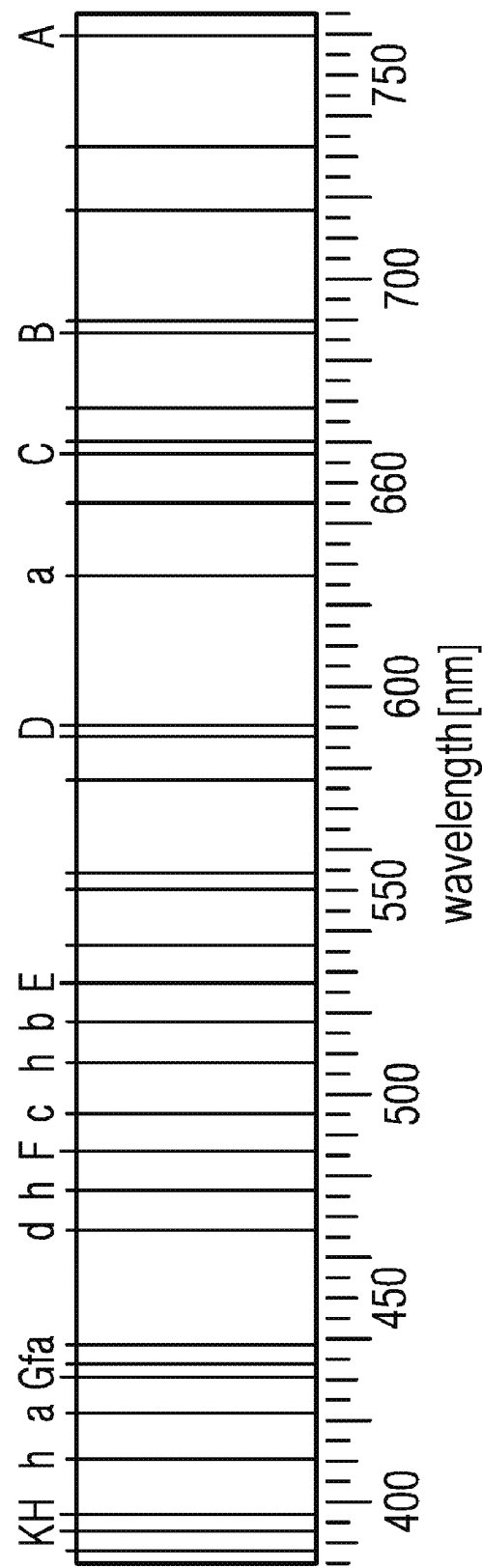

DEVICE FOR RECOGNIZING AN ARCING FAULT, AND ELECTRICAL SWITCHGEAR

PRIORITY STATEMENT

This application is the national phase under 35 U.S.C. § 371 of PCT International Application No. PCT/EP2016/061557 which has an International filing date of Mar. 23, 2016, which designated the United States of America and which claims priority to German patent application number DE 102015217633.9 filed Sep. 15, 2015, the entire contents of which are hereby incorporated herein by reference.

FIELD

An embodiment of the invention generally relates to a device for recognizing an arcing fault, and/or to an electrical switchgear incorporating such a device.

BACKGROUND

The secure detection of arcing faults in electrical switchgear is required. Above all, it must be possible to distinguish between arcing faults and other manifestations of light, in order to permit the implementation of targeted measures for the reduction of damage associated with the active duration of the arcing fault.

Arcing faults can occur in response to a variety of events in electrical switchgear. For example, arcing faults can be caused by overvoltage effects between different phases, or between a current-carrying phase and a ground connection, for example of the housing. Additionally, the occurrence of arcing faults can be exacerbated, for example, by contamination, as contamination can alter and increase the conductivity of surfaces in electrical switchgear.

Moreover, arcing faults can occur after the servicing of electrical switchgear if, for example, a tool is unintentionally left in the electrical switchgear, and this tool enters into contact with current-carrying parts. It is also possible, for example as a result of vibrations associated with the switching of the electrical switches in the switchgear, for a tool which is left in the switchgear to alter its position, such that the tool is only in a position in the electrical switchgear in which arcing faults can occur after the occurrence of such an event.

Conventional solutions for the recognition of arcing faults only measure the occurrence of light effects in electrical switchgear, which is not sufficient for the secure recognition of an arcing fault, as light effects can also be caused by the incidence of external light, in the absence of an arcing fault. Consequently, at least a second measured variable is additionally associated with the light signal, in order to reach a conclusion as to whether an arcing fault is present or otherwise.

The second measured variable can be constituted, for example, on the basis of the monitoring of the current flux in the switchgear and, in the event of a rapidly-rising current associated with the light effect, it is possible to reach a conclusion as to whether an arcing fault is present or otherwise. It is also possible, as a further measured variable, to undertake the monitoring of air pressure and, in the event of a rapid rise in pressure associated with the light effect, to reach a conclusion as to whether an arcing fault is present or otherwise.

In the event of the occurrence of an arcing fault in electrical switchgear, countermeasures must be implemented as rapidly as possible, as the electrical switchgear will otherwise be severely damaged by vaporized metal. The monitoring of the current for an overcurrent criterion, and likewise the measurement of the pressure, require over 10 ms (milliseconds) and, in consequence, are often too slow, resulting in the excessively late detection of an arcing fault.

SUMMARY

At least one embodiment of the invention is directed to a device for recognizing an arcing fault, and/or an electrical switchgear incorporating such a device which, alternatively, can recognize an arc and implement corresponding countermeasures in a rapid and highly reliable manner.

At least one embodiment of the invention is directed to a device for recognizing an arcing fault. Advantageous configurations of the device according to at least one embodiment of the invention are disclosed in the claims. At least one embodiment of the invention is directed to an electrical switchgear. Advantageous configurations of the electrical switchgear are disclosed in the claims.

At least one embodiment of the invention is directed to a device for recognizing an arcing fault in incident light. In at least one embodiment, the device comprises a sensor for detecting absorption lines of the incident light, and an evaluation unit which generates an evaluation signal when characteristic absorption lines are present.

At least one embodiment of the invention is directed to an electrical switchgear, including the device according to at least one embodiment of the invention for recognizing an arcing fault, wherein the sensor of the device detects the light within the electrical switchgear.

BRIEF DESCRIPTION OF THE DRAWINGS

In the figures:

FIG. 1 shows a device of an example embodiment, including a sensor and an evaluation unit;

DETAILED DESCRIPTION OF THE EXAMPLE EMBODIMENTS

Figure 2:
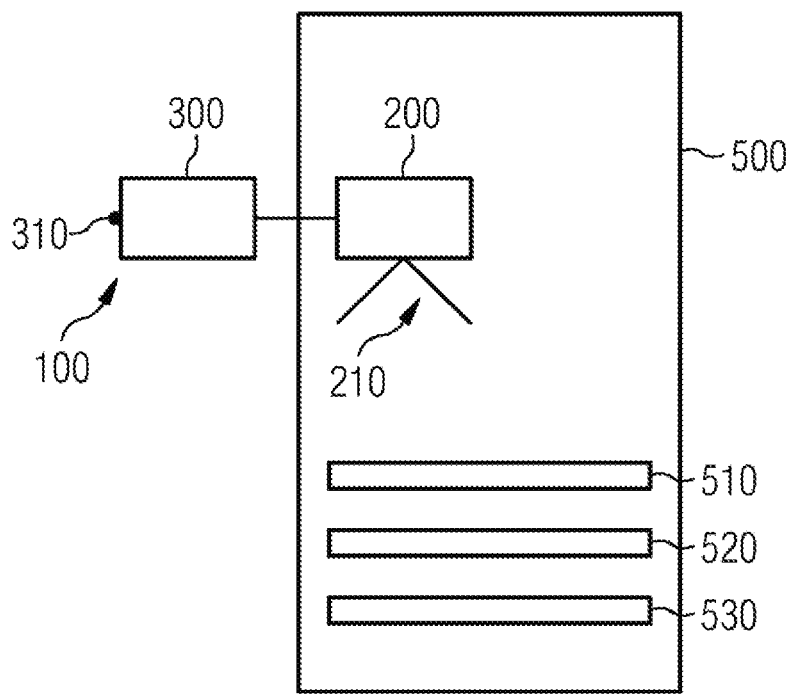
FIG. 2 shows switchgear of an example embodiment, with a device for recognizing an arcing fault, wherein the evaluation unit is arranged outside the switchgear.

At least one embodiment of the invention is directed to a device for recognizing an arcing fault in incident light. In at least one embodiment, the device comprises a sensor for detecting absorption lines of the incident light, and an evaluation unit which generates an evaluation signal when characteristic absorption lines are present.

Advantageously, the device according to at least one embodiment of the invention recognizes an arcing fault in a highly reliable manner, as the material which is vaporized by the arcing fault is detected by way of absorption lines. The detection and evaluation of further measured variables are not required.

In one example configuration, the evaluation signal is present at an output of the evaluation unit.

In a further example configuration, the sensor comprises a sensor window, through which the incident light is detected.

In a further example configuration, the evaluation signal is generated in response to the presence of absorption lines for copper, aluminum or iron (Cu, Al, Fe).

In one example configuration, the sensor detects Fraunhofer lines.

At least one embodiment of the invention is directed to an electrical switchgear, including the device according to at least one embodiment of the invention for recognizing an arcing fault, wherein the sensor of the device detects the light within the electrical switchgear.

In one example configuration of the electrical switchgear, the evaluation signal initiates countermeasures for the reduction and/or for the clearance of the arcing fault.

In a further example configuration, the sensor of the device for recognizing an arcing fault is arranged within the electrical switchgear.

In one example configuration, the electrical switchgear comprises conductor rails, which are formed of copper or aluminum (Cu, Al). The electrical switchgear can also comprise a housing, which is formed of iron or steel.

In a further example configuration, the evaluation unit can generate an evaluation signal within a few ms (milliseconds). The evaluation unit can generate an evaluation signal within a time of 3 ms to 6 ms.

In one example configuration, the sensor detects Fraunhofer lines for the metals which are employed in the switchgear (e.g. Cu, Al, Fe).

The above-mentioned properties, characteristics and advantages of the present invention, and the manner in which they are achieved, will be more explicitly and clearly understood in conjunction with the following description of the example embodiments, which are described in greater detail with reference to the figures.

FIG. 1 represents the device 100 of an example embodiment, for the detection of an arcing fault in incident light. To this end, the device 100 comprises a sensor 200 for the detection of absorption lines of the incident light. To this end, the sensor 200 can incorporate a sensor window 210, through which the incident light is detected.

The device 100 for detecting an arcing fault in incident light additionally comprises an evaluation unit 300, which generates an evaluation signal in response to the presence of characteristic absorption lines. This evaluation signal can be present, for example, at an output 310 of the evaluation unit 300, and be subject to further processing accordingly.

The sensor 200 can, for example, detect Fraunhofer lines, which represent absorption lines of the incident light. In the following table, the most significant Fraunhofer lines are represented, according to their wavelength in nm (nanometers) and their associated elements.

| Table of Fraunhofer lines (source: wikipedia.de): | | |
|---|---|---|
| Symbol | Element | Wavelength in nm |
| y | $O_2$ | 898.765 |
| Z | $O_2$ | 822.696 |
| A | $O_2$ | 759.370 |
| B | $O_2$ | 686.719 |
| C | Hα | 656.281 |
| a | $O_2$ | 627.661 |
| $D_1$ | Na | 589.594 |
| $D_2$ | Na | 588.997 |
| $D_3$ or d | He | 587.562 |
| e | Hg | 546.073 |
| $E_2$ | Fe | 527.039 |
| $b_1$ | Mg | 518.362 |
| $b_2$ | Mg | 517.270 |
| $b_3$ | Fe | 516.891 |
| $b_4$ | Fe | 516.751 |
| $b_4$ | Mg | 516.733 |
| c | Fe | 495.761 |
| F | Hβ | 486.134 |
| d | Fe | 466.814 |
| e | Fe | 438.355 |
| G' | Hγ | 434.047 |
| G | Fe | 430.790 |
| G | Ca | 430.774 |
| h | Hδ | 410.175 |
| H | $Ca^+$ | 396.847 |
| K | $Ca^+$ | 393.368 |
| L | Fe | 382.044 |
| N | Fe | 358.121 |
| P | $Ti^+$ | 336.112 |
| T | Fe | 302.108 |
| t | Ni | 299.444 |

The device 100 for recognizing an arcing fault can generate the evaluation signal, specifically in the presence of absorption lines for copper, aluminum or iron.

FIG. 2 represents an electrical switchgear incorporating a device 100 for recognizing an arcing fault. The sensor 200 of the device 100 for recognizing an arcing fault thus detects the light within the electrical switchgear 500. This can be configured, for example, such that the sensor 200 is located in the electrical switchgear 500. It is also conceivable that the sensor 200 detects the light within the electrical switchgear 500 through a window, whereas the sensor 200 is arranged outside the electrical switchgear 500.

According to FIG. 2, the evaluation unit 300, by which the evaluation signal is generated, is arranged outside the electrical switchgear 500. The evaluation signal, which can be present at the output 310 of the evaluation unit 300, can be subject to further processing for the initiation of countermeasures for the reduction or clearance of the arcing fault. For example, where the evaluation signal is present, the current in the electrical switchgear 500 can be switched-off or reduced.

The electrical switchgear 500 comprises conductor rails 510; 520; 530 which are formed, for example, of copper or aluminum. Upon the occurrence of an arcing fault on the conductor rails 510; 520; 530, the material of which the conductor rails 510; 520; 530 are formed is vaporized. The characteristic absorption lines for the elements copper or aluminum are thus detected by the sensor 200.

The electrical switchgear can comprise a housing, which is formed of iron or steel. If an arcing fault is detected on the housing of the electrical switchgear 500, the sensor 200 detects characteristic absorption lines for iron, and generates an evaluation signal.

Figure 3:
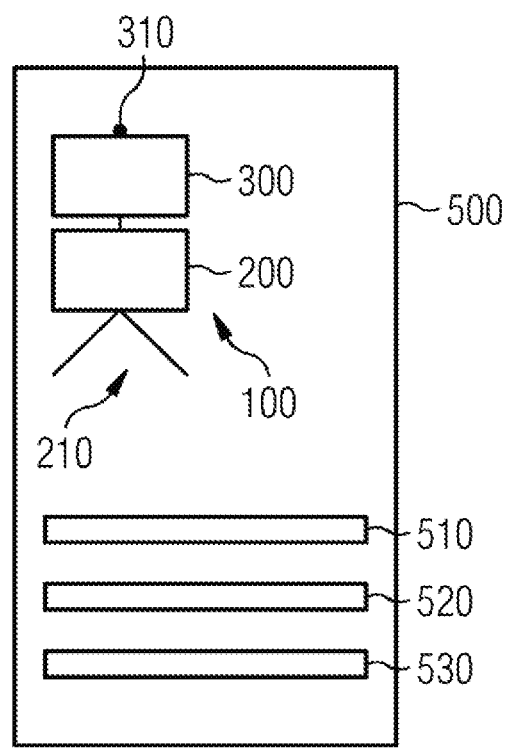
FIG. 3 shows switchgear of an example embodiment with a device for recognizing an arcing fault, wherein the evaluation unit is arranged within the switchgear.

The evaluation unit 300 can be configured such that it is likewise arranged within the electrical switchgear 500, as represented in FIG. 3. The evaluation unit 300 can generate an evaluation signal within a few ms. Preferably, the evaluation unit 300 can generate an evaluation signal within 3 ms to 6 ms.

As a countermeasure for the reduction and/or clearance of the arcing fault, the evaluation unit 300, upon the generation of the evaluation signal, can also initiate a switchover to a low-impedance circuit path, such that the arcing fault is cleared by way of this high-speed grounding.

The reliable distinction of an arcing fault from any other light effects is achieved by the evaluation of the Fraunhofer lines for the light observed. If the metals of the conductor rails 510; 520; 530 employed in the electrical switchgear 500 such as, for example copper or aluminum, and/or the metals of the conductive housing such as, for example, iron, are present in the spectrum, it can reliably be assumed that an arcing fault is present. In such a case, with no additional safeguard in the form of a second or third measuring procedure, a countermeasure can be implemented such as, for example, the switching-off or reduction of the current, or high-speed grounding.

Advantageously, in the device 100 for recognizing an arcing fault in incident light, a further measuring procedure for the secure detection of an arcing fault can be omitted. Recognition of an arcing fault can be achieved within microseconds, wherein the consideration of a further indicator, such as an overcurrent or a rise in pressure lasting for a number of milliseconds, is not necessary for the secure detection of the arcing fault. By the employment of the device 100 for recognizing an arcing fault, countermeasures for the clearance of the arcing fault can be implemented far earlier, thus resulting in a substantial reduction in damage to the electrical switchgear 500.

What is claimed is:

1. A device for recognizing an arcing fault in incident light, comprising:
   a sensor configured to detect absorption lines of the incident light; and
   an evaluation unit configured to generate an evaluation signal when characteristic absorption lines are present in the detected absorption lines.

2. The device for recognizing an arcing fault of claim 1, wherein the evaluation signal is present at an output of the evaluation unit.

3. The device for recognizing an arcing fault of claim 2, wherein the sensor includes a sensor window, through which the incident light is detected.

4. The device for recognizing an arcing fault of claim 2, wherein the evaluation signal is generated in response to the presence of absorption lines for Cu, Al or Fe.

5. The device for recognizing an arcing fault of claim 2, wherein the sensor detects Fraunhofer lines.

6. The device for recognizing an arcing fault of claim 1, wherein the sensor includes a sensor window, through which the incident light is detected.

7. The device for recognizing an arcing fault of claim 6, wherein the evaluation signal is generated in response to the presence of absorption lines for Cu, Al or Fe.

8. The device for recognizing an arcing fault of claim 6, wherein the sensor detects Fraunhofer lines.

9. The device for recognizing an arcing fault of claim 1, wherein the evaluation signal is generated in response to the presence of absorption lines for Cu, Al or Fe.

10. The device for recognizing an arcing fault of claim 9, wherein the sensor detects Fraunhofer lines.

11. The device for recognizing an arcing fault of claim 1, wherein the sensor detects Fraunhofer lines.

12. An electrical switchgear, comprising: the device for recognizing an arcing fault of claim 1, wherein the sensor is further configured to detect the incident light within the electrical switchgear.

13. The electrical switchgear of claim 12, wherein the evaluation signal initiates countermeasures for at least one of reduction and clearance of the arcing fault.

14. The electrical switchgear of claim 13, wherein the sensor of the device is arranged within the electrical switchgear.

15. The electrical switchgear of claim 13, further comprising:
   conductor rails, formed of Cu or Al.

16. The electrical switchgear of claim 13, further comprising:
   a housing, formed of Fe or steel.

17. The electrical switchgear of claim 13, wherein the evaluation unit is further configured to generate the evaluation signal within 10 ms.

18. The electrical switchgear of claim 12, wherein the sensor of the device is arranged within the electrical switchgear.

19. The electrical switchgear of claim 12, further comprising:
   conductor rails, formed of Cu or Al.

20. The electrical switchgear of claim 12, further comprising:
   a housing, formed of Fe or steel.

21. The electrical switchgear of claim 12, wherein the evaluation unit is further configured to generate the evaluation signal within 10 ms.

22. The electrical switchgear of claim 21, wherein the evaluation unit is further configured to generate the evaluation signal within a time of 3 ms to 6 ms.

23. The electrical switchgear of claim 12, wherein the sensor is further configured to detect Fraunhofer lines for the metals which are employed in the electrical switchgear.

24. The device of claim 1, wherein the evaluation unit is configured to generate the evaluation signal in response to the presence of absorption lines for a vaporized metal when characteristic absorption lines are present in the detected absorption lines.

* * * * *